United States Patent
Bieling et al.

(10) Patent No.: US 11,003,086 B2
(45) Date of Patent: May 11, 2021

(54) ILLUMINATION OPTICAL DEVICE FOR PROJECTION LITHOGRAPHY

(71) Applicant: Carl Zeiss SMT GmbH, Oberkochen (DE)

(72) Inventors: Stig Bieling, Aalen (DE); Markus Deguenther, Florstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/924,702

(22) Filed: Jul. 9, 2020

(65) Prior Publication Data

US 2020/0341384 A1    Oct. 29, 2020

Related U.S. Application Data

(63) Continuation of application No. PCT/EP2019/050058, filed on Jan. 3, 2019.

(30) Foreign Application Priority Data

Jan. 23, 2018    (DE) .......................... 102018201009.9

(51) Int. Cl.
*G03F 7/20* (2006.01)

(52) U.S. Cl.
CPC .......... *G03F 7/70075* (2013.01); *G03F 7/702* (2013.01); *G03F 7/70191* (2013.01)

(58) Field of Classification Search
CPC ............. G03F 7/70075; G03F 7/70091; G03F 7/70191; G03F 7/702

(Continued)

(56) References Cited

U.S. PATENT DOCUMENTS 6,285,443 B1   9/2001  Wangler et al.
6,554,464 B1 * 4/2003  Hawryluk ............. G02B 27/09
                                                    362/259

(Continued)

FOREIGN PATENT DOCUMENTS

DE      195 20 563 A1   12/1996
DE    10 2007 055 4      6/2009

(Continued)

OTHER PUBLICATIONS

German Examination Report, with translation thereof, for corresponding Appl No. 10 2018 201 009.9, dated Sep. 17, 2018.

(Continued)

*Primary Examiner* — Colin W Kreutzer
(74) *Attorney, Agent, or Firm* — Fish & Richardson P.C.

(57) ABSTRACT

An illumination optical unit for projection lithography illuminates an object field. The illumination optical unit has an optical rod with an entrance area and an exit area for illumination light. The optical rod is configured so that the illumination light is mixed and homogenized at lateral walls of the optical rod by multiple in-stances of total internal reflection. At least one correction area serves to correct a field dependence of an illumination angle distribution when illuminating the object field. The correction area is disposed in the region of the exit area of the optical rod. This can result in an illumination optical unit, in which an unwanted field dependence of a specified illumination angle distribution is reduced or entirely avoided, even in the case of illumination angle distributions with illumination angles deviating extremely from a normal incidence on the object field.

20 Claims, 2 Drawing Sheets

(58) Field of Classification Search
USPC .................................................... 355/67, 71
See application file for complete search history.

(56) References Cited

U.S. PATENT DOCUMENTS

| | | | |
|---|---|---|---|
| 6,704,092 B2 | 3/2004 | Shiraishi | |
| 7,209,218 B2 | 4/2007 | Kawakami et al. | |
| 2002/0126931 A1* | 9/2002 | Van Der Lei | G03F 7/70075 |
| | | | 385/1 |
| 2003/0038931 A1 | 2/2003 | Toyoda et al. | |
| 2004/0156212 A1* | 8/2004 | Kamijima | G02B 27/0994 |
| | | | 362/551 |
| 2005/0270513 A1 | 12/2005 | Dierichs et al. | |
| 2006/0126049 A1 | 6/2006 | Deguenther et al. | |
| 2006/0153518 A1* | 7/2006 | Abu-Ageel | G02B 27/0927 |
| | | | 385/146 |
| 2007/0285644 A1 | 12/2007 | Brotsack et al. | |

FOREIGN PATENT DOCUMENTS

| | | | |
|---|---|---|---|
| JP | 2007/027240 A | | 2/2007 |
| JP | 2013222056 A | * | 10/2013 |
| WO | WO 2003/046663 A2 | | 6/2003 |
| WO | WO 2005/006079 A1 | | 1/2005 |
| WO | WO 2009/024 164 A | | 2/2009 |

OTHER PUBLICATIONS

Translation of International Search report for corresponding Appl No. PCT/EP2019/050058, dated May 7, 2019.

* cited by examiner

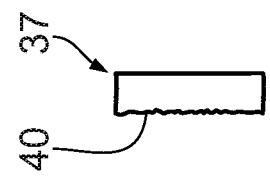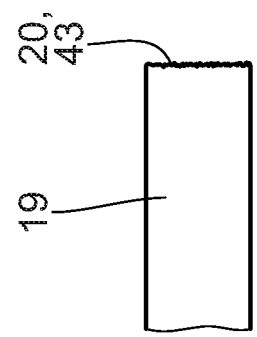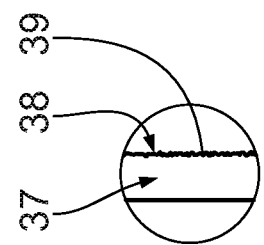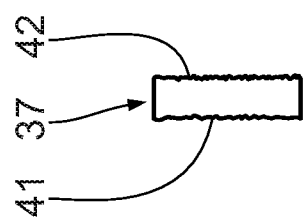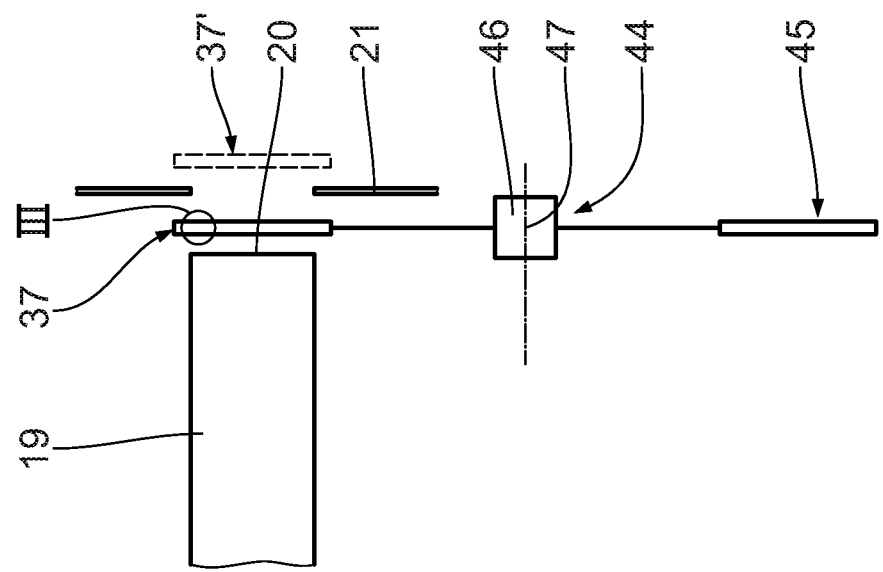

ILLUMINATION OPTICAL DEVICE FOR PROJECTION LITHOGRAPHY

CROSS-REFERENCE TO RELATED APPLICATIONS

The present application is a continuation of, and claims benefit under 35 USC 120 to, international application PCT/EP2019/050058, filed Jan. 3, 2019, which claims benefit under 35 USC 119 of German Application No. 10 2018 201 009.9, filed Jan. 23, 2018. The entire disclosure of these applications are incorporated by reference herein.

FIELD

The disclosure relates to an illumination optical unit for projection lithography. Furthermore, the disclosure relates to an optical system including such an illumination optical unit, an illumination system including such an optical system, and a projection exposure apparatus including such an illumination system.

BACKGROUND

Illumination optical units for projection lithography are known from DE 195 20 563 A1. Further illumination optical units are known from WO 2005/006079 A1, WO 2003/046663A2, DE 10 2007 055 443 A, U.S. Pat. No. 7,209,218 A, US 2003/0038931 A, U.S. Pat. No. 6,704,092 A, WO 2009/024 164 A and JP 2007/27240 A.

SUMMARY

The present disclosure seeks to develop an illumination optical unit in which an unwanted field dependence of a specified illumination angle distribution is reduced or entirely avoided, even in the case of illumination angle distributions with illumination angles deviating extremely from a normal incidence on the object field.

In a general aspect, the disclosure provides an illumination optical unit for projection lithography for illuminating an object field. The illumination optical unit includes an optical rod with an end-side entrance area for illumination light and with an opposing, end-side exit area for the illumination light. The optical rod is designed in such a way that the illumination light is mixed and homogenized at lateral walls of the optical rod by multiple instances of total internal reflection. The illumination optical unit include at least one correction area for correcting a field-dependence of an illumination angle distribution when illuminating the object field. The correction area is disposed in the region of the exit area of the optical rod.

According to the disclosure, it was recognized that an unwanted field dependence of an illumination angle distribution can be reduced or at least largely avoided by the use of an optical correction area in the region of an exit area of the optical rod. The correction area can have a refractive effect. Correction structures on the correction area can be describable by way of an asphere equation. The correction structures can have a maximum sagittal height of 20 μm, of 10 μm, of 8 μm or of 6 μm. The correction structures can have a maximum structure flank gradient of 5 μm/mm, of 3 μm/mm, of 2 μm/mm or of 1.5 μm/mm. Such a correction area makes a field-dependent correction option available, the latter being able to reduce or largely avoid an unwanted field dependence of an illumination angle distribution which, for example, may be caused by imaging aberrations of the illumination optical unit. The correction area can simultaneously represent the exit area of the optical rod. Such an embodiment of the correction area avoids an additional optical correction element that carries the correction area.

The correction area can be disposed close to a plane conjugate to an object plane of the object field. Such an arrangement of the correction area was found to be suitable for the field-dependent compensation or correction effect. A near-field arrangement of the correction area from a field plane of the illumination optical unit is present if a parameter P, which is defined in WO 2009/024 164 A, is no more than 0.3.

The correction area can simultaneously represent the exit area from the optical rod. Such embodiments can avoid an additional optical correction element.

The correction area can constituent part of a correction element that is disposed separately from the optical rod. Such embodiments can increase the flexibility that is achievable by way of the correction by the correction area.

An exit area of the correction element can be embodied as a correction area, and/or an exit area of the correction element can be embodied as a correction area. Such designs were found to be particularly suitable.

A combination of the correction area arrangement options specified above is also possible.

The illumination optical unit can further include a correction element interchange holder for exchanging the correction element with at least one further correction element. Such an interchange holder can facilitate an adaptation of the corrective effect of the respective correction area to a desired illumination angle distribution, i.e., to a desired illumination setting. Instead of changing between various correction elements, a specific correction element can also be extended and retracted between a correction position and a neutral position by way of the interchange holder, and so none of the correction elements of the interchange holder are optically effective in one work position of the interchange holder.

The illumination optical unit can further include an interchange holder drive of the correction element inter-change holder for the driven correction element exchange. Such an interchange holder drive can facilitate an automated correction element change. The interchange holder drive can be signal-connected to a central control device of the illumination optical unit.

An optical system can include an illumination optical unit according to the disclosure and a projection optical unit for imaging the object field into an image field. An illumination system can include such an optical system and a light source. A projection exposure apparatus can include such an illumination system, a reticle holder for holding a reticle in an object plane, a projection lens for imaging the object field into an image field in an image plane, and a wafer holder for holding a wafer in the image plane. Advantages of such embodiments can correspond to those that have already been explained above with reference to the illumination optical unit according to the disclosure. The light source can be a DUV (deep ultraviolet) light source.

A microstructured or nanostructured component, especially a semiconductor chip, for example a memory chip, can be produced using the projection exposure apparatus.

BRIEF DESCRIPTION OF THE DRAWINGS

Exemplary embodiments of the disclosure are explained in greater detail below with reference to the drawing. In the drawing:

FIG. 2 shows an enlarged excerpt of FIG. 1 showing additional details in the region of a correction element with a correction area for correcting a field dependence of an illumination angle distribution when illuminating an object field, disposed in the region of an exit area of an optical rod of an illumination optical unit of the projection exposure apparatus according to FIG. 1;

FIG. 3 shows an enlarged excerpt of a detail III in FIG. 2 in the region of the correction area;

FIGS. 4 and 5 show views, similar to the enlarged excerpt according to FIG. 3, of further embodiments of correction areas, which can be used instead of the correction area according to FIG. 3 in the illumination optical unit; and FIG. 6 shows a further embodiment of an optical rod of the illumination optical unit, in this case embodied with a correction area, which can be used as an alternative or in addition to the correction areas according to FIGS. 3 to 5 and which simultaneously represents an exit area of the optical rod.

EXEMPLARY EMBODIMENTS OF THE DISCLOSURE

Figure 1:
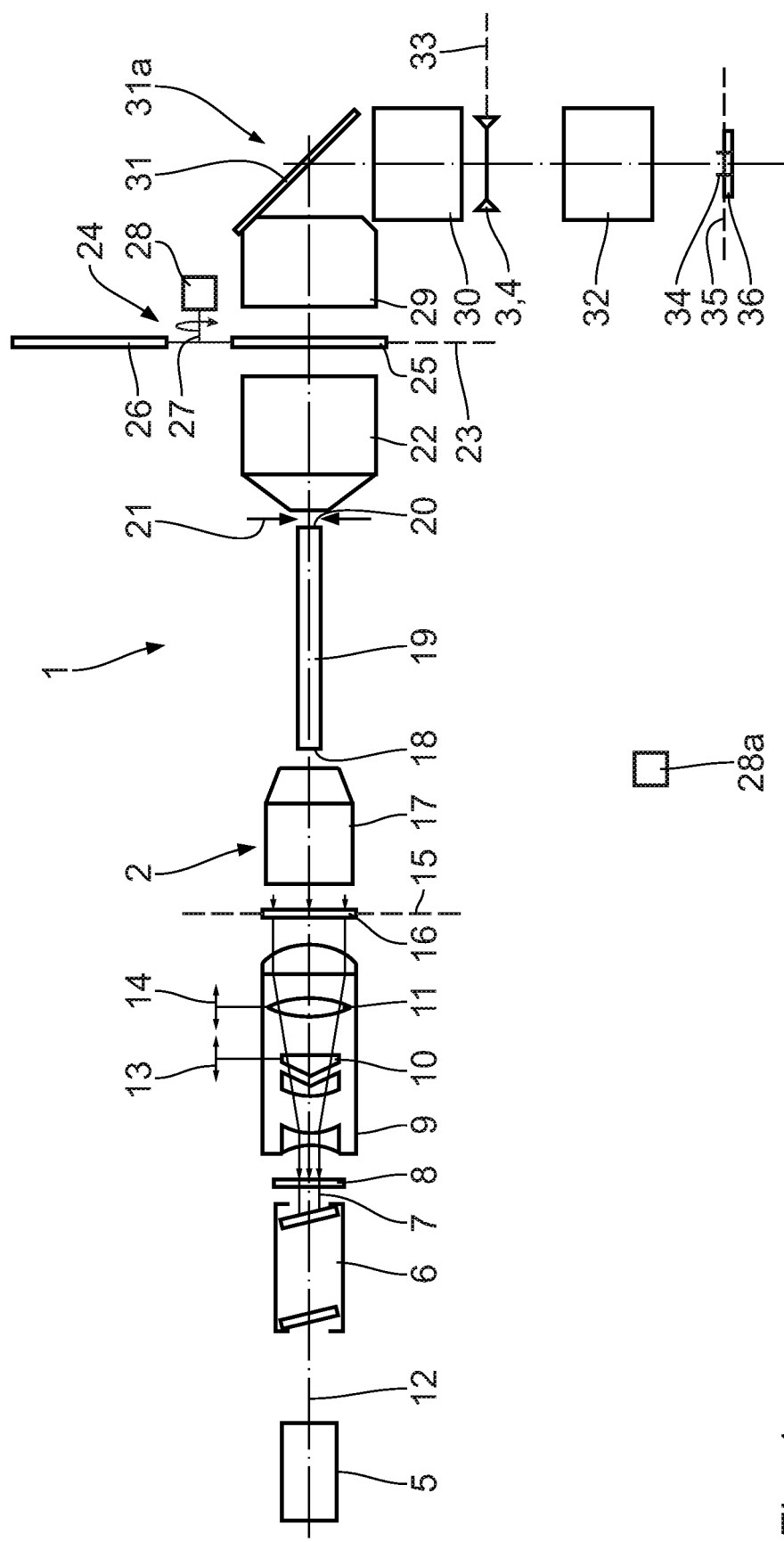
FIG. 1 shows a schematic overview of a microlithographic projection exposure apparatus in a meridional section.

A microlithographic projection exposure apparatus 1 has an illumination system with an illumination optical unit 2 for illuminating a defined illumination and object field 3 at the location of an object and a reticle 4, which represents a template to be projected for the production of microstructured or microelectronic semiconductor components. The reticle 4 is held by a reticle holder, not shown here.

A laser in the deep ultraviolet (DUV) is used as a light source 5 for the illumination light of the illumination system. This could be an ArF excimer laser. Other DUV sources are also possible.

A beam expander 6, for example a mirror arrangement known from DE-A 41 24 311, is used to reduce coherence and generate an expanded, collimated, rectangular cross section of a beam of the illumination light 7.

A first diffractive optical raster element (DOE) 8 is disposed in an object plane of a condenser 9. The condenser 9 includes an axicon pair 10 and a lens element 11 with a positive focal length. The spacing of the axicon elements of the axicon pair 10 from one another and the position of the lens element 11 are adjustable along an optical axis 12 of the illumination optical unit 2, as indicated by double-headed arrows 13, 14 in FIG. 1. Therefore, the condenser 9 represents a zoom optical unit.

A further diffractive and/or refractive optical raster element (ROE) 16 is disposed in an exit pupil plane 15 of the condenser 9. To the extent that the raster element 16 has a diffractive embodiment, it could be embodied as a computer-generated hologram (CGH), for example. As an alternative or in addition to the embodiment as a diffractive optical element, the ROE 16 can have a refractive embodiment, for example as a refractive optical raster element, such as a microlens array. Although a diffractive embodiment is also possible, the raster element 16 is denoted ROE below.

Using the first DOE 8, a defined intensity distribution in the pupil plane 15 is set at the location of the ROE 16. This generates a specified so-called illumination setting, i.e., a defined distribution of illumination angles over the object field 3. Therefore, the first DOE 8 represents an illumination angle specification element for specifying an illumination angle distribution over the object field 3.

An input coupling optical unit 17 disposed downstream of the ROE 16 transmits the illumination light to an end-side entrance area 18 of a transparent optical rod in the form of a glass rod 19. The rod 19 mixes and homogenizes the illumination light by multiple internal reflection at the lateral walls of the rod 19. An intermediate field plane in which a reticle masking system (REMA) 21, an adjustable field stop, is disposed is located directly on an end-side exit area 20 of the rod 19 lying opposite the entrance area 18. A correction area for correcting a field dependence of an illumination angle distribution when illuminating the object field 3 is disposed in the region of the exit area 20 of the optical rod 19, exemplary embodiments of the correction area still being described below, especially in conjunction with FIGS. 2 to 6.

The ROE 16 is used to adapt the cross-sectional shape of the illumination beam 7 to the rectangular shape of the entrance area 18 of the rod 19. The ROE 16 therefore also serves as an illumination intensity specification element for specifying an illumination intensity distribution over the object field 3.

A condenser 22 is disposed downstream of the REMA 21. A stop interchange holder 24 with a plurality of stops or filters can be disposed in an exit pupil plane 23 of the condenser 22, two stops 25, 26 of the plurality of stops or filters being illustrated in FIG. 1. The stop interchange holder 24 carries the various stops in the style of a stop carousel. For the purposes of changing the stop, the carousel is driven about a drive shaft 27 of a drive motor 28, which is signal-connected to a central control device 28a of the projection exposure apparatus 1. The stops of the stop interchange holder 24 are subdivided into an even number of separate stop sections. The stop sections could be stops completely blocking the illumination light, neutral density filters attenuating the illumination light by a predetermined percentage or polarization filters linearly polarizing the illumination light.

A further condenser with lens-element groups 29, 30 is displaced downstream of the pupil plane 23 disposed downstream of the rod 19. A 90° deflection mirror 31 for the illumination light is disposed between the two lens-element groups 29, 30. The condenser 22 and the further condenser with the two lens-element groups 29, 30 form a lens 31a, which images the intermediate field plane of the REMA 21 onto the reticle 4. The pupil plane 23 represents an internal pupil plane of this lens 31a.

A projection lens 32 images the object field 3, which lies in an object plane 33, into an image field 34 in an image plane 35. The image field 34 is part of the surface of a wafer 36 to be exposed, which is provided with a coating that is sensitive to the illumination light. The wafer 36 is held by a wafer holder, not shown here. During projection exposure, the reticle 4 and the wafer 36 are scanned synchronously with one another. An intermittent displacement of the holders of the reticle 4 and of the wafer 36, a so-called stepper operation, is also possible.

With the exception of the deflection mirror 31, the various beam-guiding or beam-shaping components of the projection exposure apparatus 1 are indicated as refractive components. However, these could equally be catadioptric or reflective components.

FIG. 2 shows an enlarged excerpt, which elucidates further details, of the illumination optical unit 2 in the region of the exit area 20 of the rod 19 and the REMA field stop 21.

An optical correction element 37 is disposed in the beam path of the illumination light 7 between the exit area 20 and the REMA field stop 21.

FIG. 3 shows an enlarged excerpt of the correction element 37. An exit area of the correction element 37 is embodied as an optical correction area 38 with correction structures 39. The correction area 38 is used to correct a field dependence of an illumination angle distribution of the illumination light 7 when illuminating the object field 3. The correction area 38 can have a refractive effect. The correction structures 39 have a maximum sagittal height, i.e., a maximum amplitude in relation to a best fit reference area, for example in relation to a spherical reference area, of 20 µm. The maximum sagittal height can also be 10 µm, 8 µm, 6 µm or could be even lower. The correction structures 39 have a maximum structure flank gradient of 5 µm/mm. This maximum gradient can also be 3 µm/mm, 2 µm/mm or else 1.5 µm/mm and could be even lower.

On account of the arrangement close to the REMA field stop 21, the correction area 38 is disposed close to a plane conjugate to the object plane 33 of the object field 3.

For characterizing a field proximity of the position of the correction area 38 within the illumination optical unit 2, the following parameter P can be used:

$$P(M)=D(SA)/(D(SA)+D(CR))$$

Here:

D(SA) is the diameter of a sub-aperture in the correction area 38;

D(CR) is the maximum spacing of chief rays of the object field 3 that is imaged by the lens 31a, measured in a reference plane (e.g., in a plane of symmetry or a meridional plane), in the correction area 38;

in a field plane, the following applies: P=0, since D(CR) is unequal to 0 and D(SA)=0; in a pupil plane, the following applies: P=1, since D(CR)=0 and D(SA) is unequal to 0.

The optical correction area 38 is disposed in such a way that the following applies: P≤0.3 (e.g., P≤0.2; P≤0.1) or P≤0.05.

A corrective effect of the correction area 38 occurs, for example, in the case of illumination settings in which illumination angles that deviate greatly from a perpendicular illumination of the object field 3 occur, such as illumination angles which deviate by no more than 20% or no more than 10% from the maximum possible illumination angle, which is restricted, for example, by an object-side numerical aperture of the lens 31a. A parameter, σ, which characterizes such extreme illumination angles represents the ratio between a maximum diameter of a pupil that is usable by the lens 31a and the pupil position from which an illumination beam that has the greatest illumination angle occurring in a currently used illumination setting emanates. σ=1 in this case means that the maximum possible illumination angle on account of the usable pupil is in fact used. σ=0 means a purely perpendicular incidence on the object field 3. The effect of the correction area 38 is advantageous, for example in the case of illumination settings where σ≥0.8 and, such as, σ≥0.9. Here, the correction structures 39 are embodied in such a way that they lead to a greatest possible proportion of the illumination light 7 being able to pass the aperture stop 25 or 26 in the pupil plane 23 without unwanted attenuation, even in the case of extreme illumination angles in the region of σ≥0.8.

The correction area 38 is able, for example, to correct or compensate imaging aberrations that occur when imaging between an arrangement plane of the REMA field stop 21 and the object plane 33, for example imaging aberrations of the oblique spherical aberration, coma, and distortion type. These imaging aberrations can have, for example, an unwanted effect on a telecentricity of the imaging and/or on a uniformity of the field illumination.

Provided these imaging aberrations were to remain uncorrected or uncompensated, they would lead to an unwanted trimming of illumination light 7 at the stops 25 and 26 in the pupil plane 23, with this trimming undesirably being dependent on the respective field point. By way of example, in the case of a dipole illumination, a coma aberration would lead to one of the two poles of the dipole illumination setting partly being trimmed by the stop 25 or 26 at one field edge whereas, at the opposite field edge, the other pole of the dipole illumination setting would be partly trimmed by this stop 25 or 26. A field-dependent telecentricity aberration would be the consequence.

A similar effect would arise on account of an oblique spherical aberration.

The correction structures 39 are embodied in such a way that, as a result, they lead to a field-dependent tilt of the illumination setting. This can compensate or correct the unwanted effect of the imaging aberrations described above. In field regions where the imaging aberration would lead to, e.g., one pole of an illumination setting being partly trimmed by the stop 25 or 26, the effect of the correction structures 39 could be such that this pole in these field regions remains within transmissive stop regions.

Knowledge of the field-dependent effect of the lens imaging aberrations on a deformation or displacement of the illumination setting in the pupil plane 23 allows calculation of the form of the correction structures 39 for correction or compensation purposes by application of, e.g., Snell's law and with knowledge of the focal length of the condenser 22. By way of example, an asphere may arise as a result for the form of the correction area 38, the asphere being able to be described as a polynomial fit with an $x^2$ and an $x^4$ term, the sagittal height of the asphere deviating by no more than 6 µm from a spherical surface, and the correction structure of the asphere having a maximum flank gradient of 1.5 µm/mm.

FIG. 4 shows an alternative embodiment of the optical correction element 37. There, the entrance area is embodied as a correction area 40 instead of the exit area, the effect of the correction area corresponding to the effect explained above with reference to the correction area 38 of the embodiment according to FIG. 4.

FIG. 5 shows a further embodiment of the optical correction element 37, with both an entrance area and an exit area being embodied as correction areas 41, 42 in that case. A combination of the effects of these two correction areas 41, 42 corresponds to the effect explained above with reference to the correction area 38.

FIG. 6 shows an embodiment in which a correction area 43 simultaneously represents the exit area 20 from the optical rod 19. The optical effect of the correction area 43 once again corresponds to the effect explained above with reference to the correction area 38.

Combinations of arrangements with the correction areas 39, 40, 41, 42 and 43 are also possible. Thus, a correction can be implemented, for example, using the correction area 43 and using at least one correction area on the optical correction element 37 at the same time.

Using dashed lines, a further arrangement possibility for the optical correction element 37 with correction areas 38 (cf. FIG. 3), 40 (cf. FIG. 4) or 41, 42 (cf. FIG. 5) is indicated at the location 37' in FIG. 2. This alternative arrangement of the optical correction element 37' is in the beam path of the illumination light 7 downstream of the REMA field stop 21. The arrangement of the optical correction element 37' is also near field with respect to the field plane of the REMA field stop 21 in the above-described sense.

The optical correction element 37 in the embodiments according to FIGS. 3 to 5 can be a constituent part of a correction element interchange holder 44. The latter includes, in addition to the active optical correction element 37 illustrated in FIG. 2, at least one further optical correction element 45, which, for the purposes of replacing the optical correction element 37, can be displaced by way of an interchange holder drive 46 between a neutral position illustrated in FIG. 2 and an active position, the optical correction element 45 in the active position taking the place of the optical correction element 37 for the purposes of replacing the latter. The correction element interchange holder 44 can be embodied in the style of an interchange holder carousel. For the purposes of exchanging the correction element, the carousel is driven about a drive shaft 47 of a about a drive shaft 47 of a drive motor of the interchange holder drive 46. The interchange holder drive 46 is signal-connected to the central control device 28a.

The correction structures of the various optical correction elements 37, 45, . . . of the correction element interchange holder 44 can be adapted to various illumination settings which can be used in the projection exposure apparatus 1.

Instead of an exchange between the various optical correction elements, the correction element interchange holder 44 can also be operated in such a way that none of the optical correction elements is active in one position of the correction element interchange holder 44.

In the microlithographic production of a microstructured or nanostructured component, the wafer 36 is initially coated, at least in sections, with a light-sensitive layer. Then, a structure on the reticle 4 is projected onto the wafer 36 using the projection exposure apparatus 1. Then, the exposed wafer 36 is processed for forming the microstructured component.

What is claimed is:

1. An illumination optical unit configured to illuminate an object field, the illumination optical unit comprising:
   an optical rod comprising:
      an end-side entrance area for illumination light; and
      an end-side exit area for the illumination light, the end-side exit area opposing the end-side entrance area; and
   an optical correction element separate from the optical rod,
   wherein:
   the optical rod is configured so that, during use, the illumination light is mixed and homogenized at lateral walls of the optical rod by multiple instances of total internal reflection; and
   the end-side exit area of the optical rod and the optical correction element are configured so that, when illuminating the object field, the end-side exit area of the optical rod and the optical correction element correct a field-dependence of an illumination angle distribution.

2. The illumination optical unit of claim 1, wherein the end-side exit area of the optical rod is close to a plane conjugate to an object plane of the object field.

3. The illumination optical unit of claim 1, wherein:

$$D(SA)/(D(SA)+D(CR)) \leq 0.3;$$

D(SA) is the diameter of a sub-aperture in the end-side exit area of the optical rod; and
D(CR) is a maximum spacing of chief rays of the object field, measured in a reference plane in the end-side exit area of the optical rod.

4. The illumination optical unit of claim 1, wherein:
the optical correction element comprises a correction area; and
the end-side exit area of the optical rod and the correction area of the optical correction element are configured so that, when illuminating the object field, the end-side exit area of the optical rod and the correction area of the optical correction element correct a field-dependence of an illumination angle distribution.

5. The illumination optical unit of claim 4, wherein the correction area of the optical correction element comprises an entrance area of the optical correction element.

6. The illumination optical unit of claim 4, wherein the correction area of the optical correction element comprises an exit area of the optical correction element.

7. The illumination optical unit of claim 6, wherein the correction interchange holder comprises an interchange holder drive configured to drive the optical correction element exchange.

8. The illumination optical unit of claim 4, wherein the correction area of the optical correction element is close to a plane conjugate to an object plane of the object field.

9. The illumination optical unit of claim 8, wherein the correction area of the optical correction element comprises an entrance area of the optical correction element.

10. The illumination optical unit of claim 8, wherein the correction area of the optical correction element comprises an exit area of the optical correction element.

11. The illumination optical unit of claim 8, further comprising a correction element interchange holder configured to exchange the optical correction element with another optical correction element.

12. The illumination optical unit of claim 11, wherein the correction interchange holder comprises an interchange holder drive configured to drive the optical correction element exchange.

13. The illumination optical unit of claim 4, wherein:

$$D(SA)/(D(SA)+D(CR)) \leq 0.3;$$

D(SA) is the diameter of a sub-aperture in the correction area of the optical correction element; and
D(CR) is a maximum spacing of chief rays of the object field, measured in a reference plane in the correction area of the optical correction element.

14. The illumination optical unit of claim 13, wherein:

$$D'(SA)/(D'(SA)+D'(CR)) \leq 0.3;$$

D'(SA) is the diameter of a sub-aperture in the end-side exit area of the optical rod; and
D'(CR) is a maximum spacing of chief rays of the object field, measured in a reference plane in the end-side exit area of the optical rod.

15. The illumination optical unit of claim 14, wherein:
the correction area of the optical correction element comprises an entrance area of the optical correction element; and
the end-side exit area of the optical rod and the correction area of the optical correction element are configured so that, when illuminating the object field, the end-side exit area of the optical rod and the correction area of the optical correction element correct a field-dependence of an illumination angle distribution.

16. The illumination optical unit of claim 14, wherein:
the correction area of the optical correction element comprises an exit area of the optical correction element; and the end-side exit area of the optical rod and the correction area of the optical correction element are configured so that, when illuminating the object field, the end-side exit area of the optical rod and the correction area of the optical correction element correct a field-dependence of an illumination angle distribution.

17. The illumination optical unit of claim 1, further comprising a correction element interchange holder configured to exchange the optical correction element with another optical correction element.

18. An optical system, comprising:
an illumination optical unit according to claim 1; and
a projection optical unit configured to image the object field into an image field.

19. An illumination system, comprising:
a light source; and
an optical system, comprising:
   an illumination optical unit according to claim 1; and
   a projection optical unit configured to image the object field into an image field.

20. An apparatus, comprising:
a light source;
an optical system, comprising:
   an illumination optical unit according to claim 1; and
   a projection optical unit configured to image the object field into an image field;
a first holder configured to hold a first object in the object field; and
a second holder configured to hold a second object in the image field,
wherein the apparatus is a projection exposure apparatus.

* * * * *